US006803618B2

(12) United States Patent
Hönigschmid et al.

(10) Patent No.: US 6,803,618 B2
(45) Date of Patent: Oct. 12, 2004

(54) MRAM CONFIGURATION HAVING SELECTION TRANSISTORS WITH A LARGE CHANNEL WIDTH

(75) Inventors: Heinz Hönigschmid, Essex Junction, VT (US); Thomas Böhm, Zorneding (DE); Thomas Röhr, Yokohama (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/436,723

(22) Filed: May 13, 2003

(65) Prior Publication Data

US 2003/0218926 A1 Nov. 27, 2003

Related U.S. Application Data

(63) Continuation of application No. PCT/DE01/04232, filed on Nov. 12, 2001.

(30) Foreign Application Priority Data

Nov. 13, 2000 (DE) .......................................... 100 56 159

(51) Int. Cl.$^7$ ............................................. H01L 29/76
(52) U.S. Cl. .......................... 257/295; 438/3; 365/158; 365/171; 365/173
(58) Field of Search .................... 257/68, 71, 295–314, 257/324–326; 438/3, 240

(56) References Cited

U.S. PATENT DOCUMENTS 5,640,343 A    6/1997  Gallagher et al.
5,940,319 A    8/1999  Durlam et al.
6,169,688 B1   1/2001  Noguchi
6,272,041 B1 * 8/2001  Naji ............................ 365/171
6,351,408 B1   2/2002  Schwarzl et al.

FOREIGN PATENT DOCUMENTS

DE    197 44 095 A1   4/1999
EP    0 469 934 A2    2/1992

OTHER PUBLICATIONS

Durlam, M. et al.: "Nonvolatile RAM Based on Magnetic Tunnel Junction Elements", Solid–State Circuits Conference, Digest of Technical Papers, ISSCC, IEEE Int., Feb. 7–9, 2000, pp. 130–131.

Boeve, H. et al.: "Technology Assessment for the Implementation of Magnetoresistive Elements with Semiconductor Components in Magnetic Random Access Memory (MRAM) Architectures", IEEE Transactions on Magnetics, vol. 35, No. 5, Sep. 1999, pp. 2820–2825.

* cited by examiner

*Primary Examiner*—David Nelms
*Assistant Examiner*—Andy Huynh
(74) *Attorney, Agent, or Firm*—Laurence A. Greenberg; Werner H. Stemer; Gregory L. Mayback

(57) ABSTRACT

The invention relates to an MRAM configuration that includes a selection transistor connected to several MTJ memory cells. The selection transistor has an increased channel width.

6 Claims, 3 Drawing Sheets

US 6,803,618 B2

MRAM CONFIGURATION HAVING SELECTION TRANSISTORS WITH A LARGE CHANNEL WIDTH

CROSS-REFERENCE TO RELATED APPLICATION

This application is a continuation of copending International Application No. PCT/DE01/04232, filed Nov. 12, 2001, which designated the United States and was not published in English.

BACKGROUND OF THE INVENTION

FIELD OF THE INVENTION

The present invention relates to an MRAM configuration (magnetoresistive random access memory) having a multiplicity of MTJ memory cells (magnetic tunnel junction) which are provided in a matrix-like manner in a memory cell array and are in each case located between bit lines running in a first direction of the memory cell array and plate lines. Digit lines are arranged at a distance from the MTJ memory cells and are aligned to the latter row by row. The digit lines extend in a second direction in the memory cell array. The second direction is essentially perpendicular to the first direction. The MRAM configuration has selection or isolation transistors which are connected to the plate lines. The selection transistors have gate terminals connected to word lines. The source-drain paths of the selection transistors are connected between the plate lines and reference-ground potential.

FIG. 3 shows an MTJ memory cell 1, which is located between a bit line B and a plate line PL. The MTJ memory cell 1 includes a soft-magnetic layer WML, a tunnel barrier layer TB, and a hard-magnetic layer HML. The orientation of the magnetization of the soft-magnetic layer WML is adjustable, while the orientation of the hard-magnetic layer HML is fixed, as is indicated by a double arrow 2 for the soft-magnetic layer WML and an arrow 3 pointing toward the left in FIG. 3 for the hard-magnetic layer HML.

Situated below the MTJ memory cell 1 is a digit line D through which a programming current $I_h$, which generates a magnetic field $H_h$, can be sent. The digit line is electrically insulated from the MTJ memory cell 1 and from the plate line PL. The programming current $I_h$ interacts with a programming current $I_0$, which can flow through the bit line B, and generates a magnetic field $H_0$. The direction of at least one of the two programming currents $I_h$ and $I_0$ must be reversible.

The plate line PL is connected via a connecting line C to a selection or isolation transistor T, whose gate electrode is connected to a word line WL. The source-drain path of the selection transistor is connected between the connecting line C and the reference-ground potential (ground).

Between the bit line B and the plate line PL, the resistance of the MTJ memory cell 1 is lower in the case of a parallel orientation of the magnetization directions in the soft-magnetic layer WML and the hard-magnetic layer HML than in the case of an antiparallel orientation of the magnetizations. Accordingly, one state with a parallel orientation of the magnetizations can be assessed as a "1", for example, if the state of an antiparallel orientation of the magnetizations is assigned a value of "0". It goes without saying that an opposite assessment of the states is also possible.

For writing to the MTJ memory cell 1, programming currents $I_0$ and $I_h$ are sent through the bit line B and the digit line D in directions such that the magnetic fields $H_0$ and $H_h$ generated by the currents set the orientation of the magnetization of the soft-magnetic layer WML parallel or antiparallel to the orientation of the magnetization of the hard-magnetic layer HML. During this writing operation, the selection transistor T is switched off so that, for example, in the case of an enhancement-mode n-channel MOS transistor, a potential of 0 V is applied to the gate thereof, that is to say to the word line WL.

FIG. 4 illustrates how the MTJ memory cell 1 of FIG. 3 is read. For this purpose, the selection transistor T is switched on and a sense current $I_s$ is sent through the bit line B, the MTJ cell 1, the plate line PL, the connecting line C and the transistor T. Depending on the magnitude of the current $I_s$, which is ascertained at the input of the bit line B, the memory content is assessed as a "1" or a "0".

FIG. 5 shows a memory cell array with MTJ memory cells 1 configured between bit lines B1, B2 and digit lines D1, D2 and D3. Each MTJ memory cell 1 is assigned a selection transistor T and the gates of the selection transistors are connected to one another row by row by word lines W1, W2 and W3.

FIG. 6 is a plan view of a memory cell array with digit lines D1 to D4, bit lines B1 to B3 and word lines W1 to W4 of the type illustrated in FIG. 5. Here, the illustration merely shows in each case an additional digit line D4, an additional bit line B3, and an additional word line W4. If the smallest feature size that can be achieved with the technology respectively employed is designated by $F^2$, then it can be seen from FIG. 6 that a unit cell covering two bits has an area requirement of 12 $F^2$, so that each memory cell has a cell size of 6 $F^2$. In this case, the channel width of each selection transistor is given by F, as can be seen from the assignment of the connecting line C leading to a ground diffusion region GD with regard to the respective word lines W1 to W4. The drain zone and the source zone are introduced into the ground diffusion region GD respectively in the region below the individual connecting lines C and on the side of the corresponding word line that is opposite to the respective connecting line C.

An MRAM configuration should be able to be written to and read from as rapidly as possible, that is to say, it should have a small internal resistance.

SUMMARY OF THE INVENTION

It is accordingly an object of the invention to provide an MRAM configuration which overcomes the above-mentioned disadvantages of the prior art apparatus of this general type.

In particular, it is an object of the invention to provide an MRAM configuration in which the internal resistance is reduced and in which the least possible area is required for a memory cell. That is to say to reduce the internal resistance in conjunction with an area requirement of at most 6 $F^2$.

With the foregoing and other objects in view there is provided, in accordance with the invention, an MRAM configuration having a memory cell array with a plurality of bit lines extending in a first direction, a plurality of digit lines extending in a second direction essentially perpendicular to the first direction, a plurality of plate lines, a plurality of word lines, and a matrix of MTJ memory cells. The MRAM configuration also has a plurality of selection transistors connected to the plurality of plate lines. The plurality of selection transistors has a plurality of gate terminals connected to the plurality of word lines. The plurality of selection transistors has source-drain paths connected between the plurality of plate lines and reference-ground potential. Each of the plurality of digit lines is located at a distance from the MTJ memory cells. The plurality of digit lines are for programming the MTJ memory cells. The plurality of digit lines are assigned to the MTJ memory cells row by row. Each one of the plurality of selection transistors is assigned to a number of the MTJ memory cells to thereby define an effective channel width/bit given by $[(2n-1)/n] \cdot F$. Here, n denotes the number of the MTJ memory cells having the one of the plurality of selection transistors assigned thereto; and $F^2$ denotes a smallest feature size that can be achieved with a respectively employed technology.

In the case of an MRAM configuration of the type mentioned in the introduction, this object is achieved by virtue of the fact that a selection transistor is in each case assigned to a plurality of MTJ memory cells such that its channel width can be determined by the number of MTJ memory cells allocated to it. In this case, a selection transistor may also be allocated to a multiplicity of memory cells.

In the inventive MRAM configuration, a ground diffusion region is preferably assigned to a respective selection transistor. In this case, the ground diffusion region may extend in a finger-shaped fashion below the respective plate lines or else overall be of an essentially rectangular design.

Finally, in the inventive MRAM configuration, the plate lines and also the connecting lines between the respective plate lines and associated selection transistors are preferably produced from polycrystalline silicon. It goes without saying that other materials may also be chosen for these lines, however. The bit lines are preferably composed of copper. The MTJ cells are constructed in a customary manner.

In the inventive MRAM configuration, the channel width of the selection transistor can be considerably increased. This means that the internal resistance is reduced, so that power losses are reduced and fast writing and reading are ensured. No loss of space arises in the realization of the inventive MRAM configuration.

What is essential to the present invention, then, is the assignment of only one selection transistor to a plurality of MTJ memory cells, which allows an increase in the channel width and thus a reduction of the internal resistance.

Other features which are considered as characteristic for the invention are set forth in the appended claims.

Although the invention is illustrated and described herein as embodied in a MRAM configuration having selection transistors of a large channel width, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Mutually corresponding structural parts are provided with the same reference symbols in all of the figures.

Figure 1:
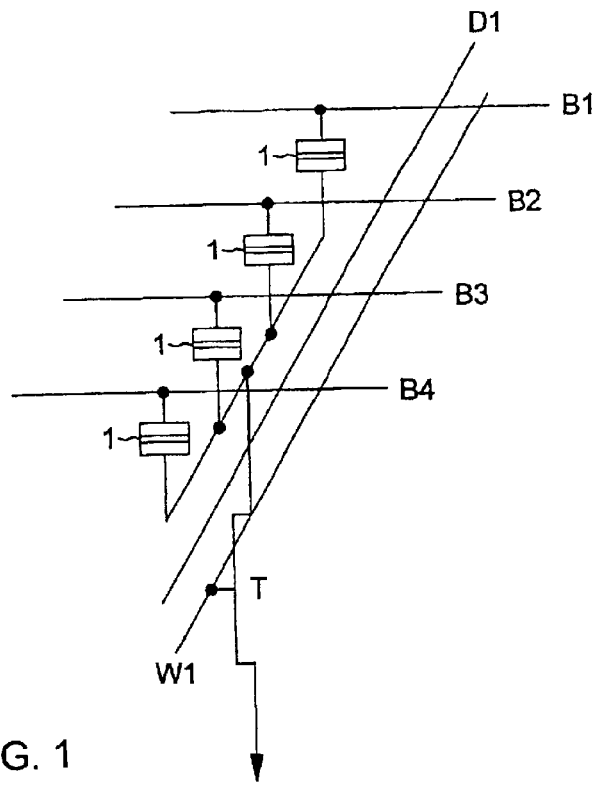
FIG. 1 is a diagrammatic perspective illustration of an exemplary embodiment of the inventive MRAM configuration.

Referring now to the figures of the drawing in detail and first, particularly, to FIG. 1 thereof, there is shown a block diagram of an inventive MRAM configuration having a memory cell array with bit lines B1 to B4 made of copper, for example, and a digit line D1 made of copper or aluminum, for example. Four MTJ memory cells 1 are assigned to a selection transistor T. The selection transistor T has a gate electrode connected to a word line W1. This "shared select" configuration of the selection transistor T makes it possible to increase the channel width thereof without reducing the dimensions of the memory cells, so that the selection transistor has a low internal resistance.

Figure 2:
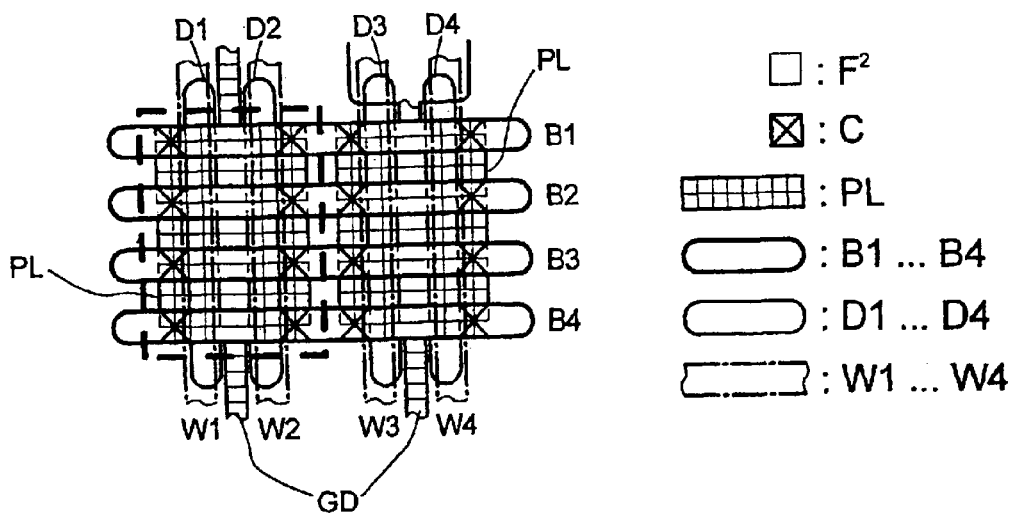
FIG. 2 is a plan view of the exemplary embodiment of the MRAM configuration.

This increase in the channel width can be seen from FIG. 2, which shows a plan view of an exemplary embodiment of the inventive MRAM configuration. In this case, admittedly, the individual plate lines P1 are again connected to the drain and the source of the transistor T via a plurality of connecting lines C, which are in each case located below the corresponding bit lines B1 to B4. The plate lines PL and the connecting lines C may be composed of doped polycrystalline silicon, for example. However, the transistor T has a channel width of 7 F given by the extent of the ground diffusion GD below the region between the bit line B1 and the bit line B4. An effective channel width/bit of (7/4) F is thus present. Generally, in this exemplary embodiment, the effective channel width/bit of the selection transistors is $[(2n-1)/n] \cdot F$, if n designates the number of MTJ memory cells which are assigned to a selection transistor.

As can be seen from FIG. 2, the cell size is $8 \text{ F} \cdot 6 \text{ F} = 48 \text{ F}^2$ for eight bits, thereby producing a cell size of the memory cell of $6 \text{ F}^2$ for one bit. In other words, the space requirement does not rise despite the considerably increased channel width of the selection transistor.

Figure 3:
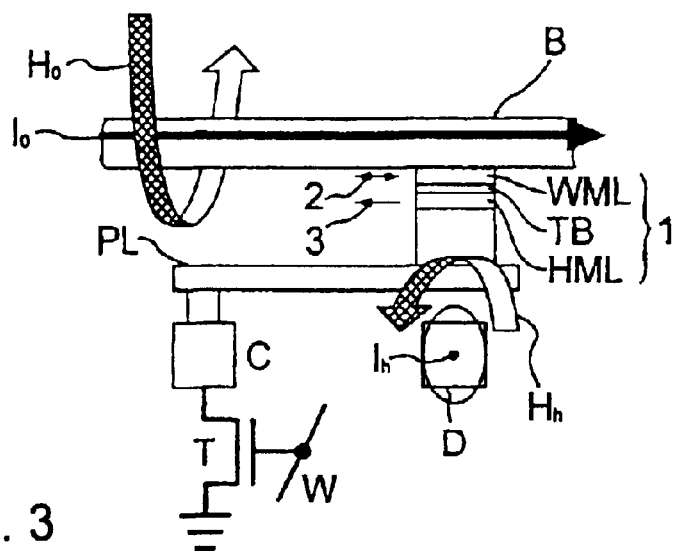
FIG. 3 is a diagrammatic view of a prior art MTJ memory cell with a selection transistor during a writing operation.
Figure 4:
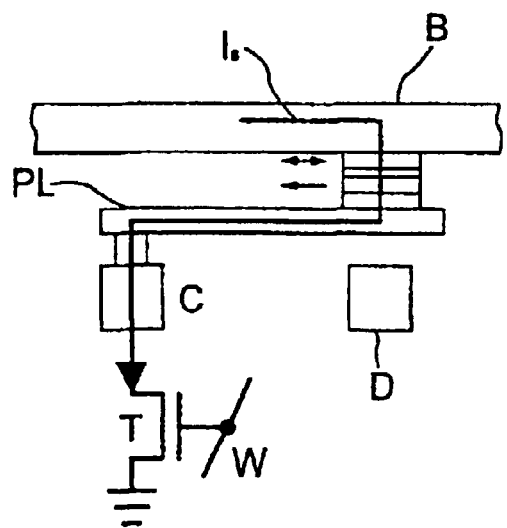
FIG. 4 is a diagrammatic view of the prior art MTJ memory cell of FIG. 3 during a reading operation.
Figure 5:
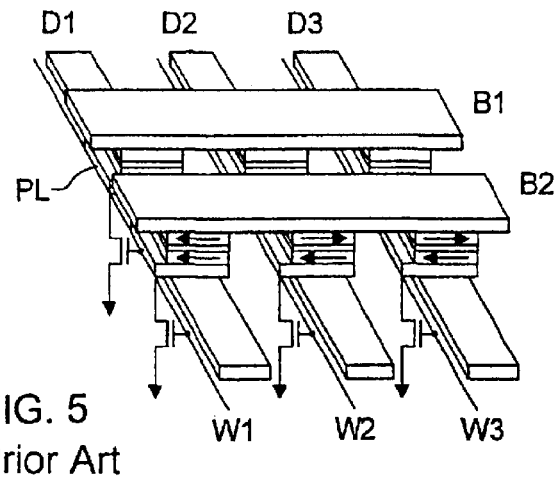
FIG. 5 is a perspective view of a prior art memory cell array with MTJ memory cells.
Figure 6:
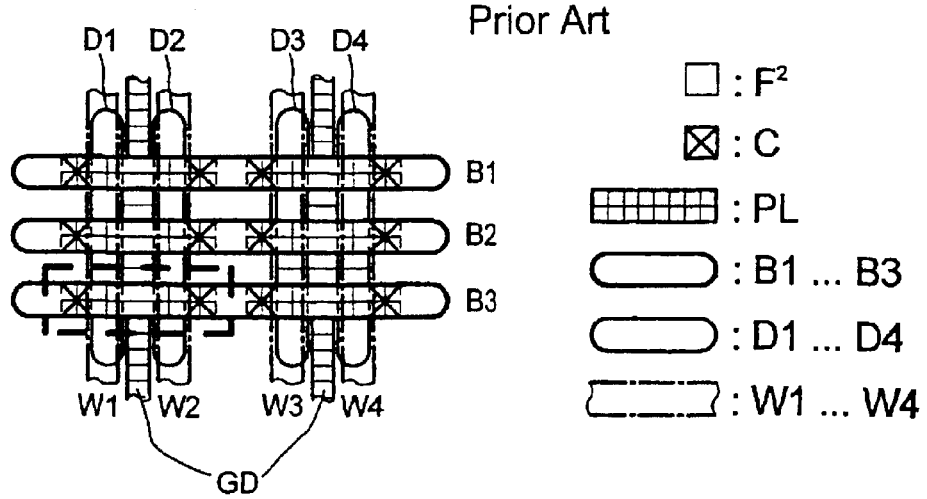
FIG. 6 is a plan view of the prior art MRAM configuration shown in FIG. 5.

Using only one selection transistor for a plurality of MTJ memory cells does not constitute a problem for writing since the selection transistor is switched off anyway in this case, as has been explained with reference to FIG. 3.

We claim:

1. An MRAM configuration, comprising:
   a memory cell array including a plurality of bit lines extending in a first direction, a plurality of digit lines extending in a second direction essentially perpendicular to the first direction, a plurality of plate lines, a plurality of word lines, and a matrix of MTJ memory cells; and
   a plurality of selection transistors connected to said plurality of plate lines, said plurality of selection transistors having a plurality of gate terminals connected to said plurality of word lines, said plurality of selection transistors having source-drain paths connected between said plurality of plate lines and reference-ground potential;
   said plurality of digit lines located at a distance from said MTJ memory cells;

said plurality of digit lines for programming said MTJ memory cells;

said plurality of digit lines assigned to said MTJ memory cells row by row;

each one of said plurality of selection transistors being assigned to a number of said MTJ memory cells to thereby define an effective channel width/bit given by $[(2n-1)/n] \cdot F$;

n denoting the number of said MTJ memory cells having said one of said plurality of selection transistors assigned thereto; and $F^2$ denoting a smallest feature size that can be achieved with a respectively employed technology.

2. The MRAM configuration according to claim 1, further comprising a ground diffusion region assigned to each one of said plurality of selection transistors.

3. The MRAM configuration according to claim 2, wherein said ground diffusion region has a finger shape extending below said plurality of plate lines.

4. The MRAM configuration according to claim 2, wherein said ground diffusion region has an essentially rectangular design.

5. The MRAM configuration according to claim 1, further comprising:

a plurality of connecting lines connecting said plurality of plate lines and said plurality of selection transistors;

said plurality of plate lines and said plurality of connecting lines formed from polycrystalline silicon.

6. The MRAM configuration according to claim 1, wherein said plurality of bit lines are composed of copper and said plurality of digit lines are composed of copper or aluminum.

* * * * *